United States Patent

Aiuchi et al.

[11] 4,170,418
[45] Oct. 9, 1979

[54] ALIGNMENT APPARATUS

[75] Inventors: Susumu Aiuchi; Minoru Ikeda; Yoshio Matsumoto, all of Yokohama, Japan

[73] Assignee: Hitachi, Ltd., Japan

[21] Appl. No.: 689,818

[22] Filed: May 25, 1976

[30] Foreign Application Priority Data

May 30, 1975 [JP] Japan .................................. 50-64272

[51] Int. Cl.² .......................................... G01B 11/26
[52] U.S. Cl. ...................................... 356/400; 356/375
[58] Field of Search ............... 356/172, 167, 152, 375, 356/400

[56] References Cited

U.S. PATENT DOCUMENTS

| | | | |
|---|---|---|---|
| 3,038,369 | 6/1962 | Davis | 250/204 |
| 3,941,980 | 3/1976 | Okamoto et al. | 356/172 |
| 3,943,359 | 3/1976 | Matsumoto et al. | 356/176 |
| 3,955,072 | 5/1976 | Johannsmeier et al. | 356/172 |

*Primary Examiner*—John K. Corbin
*Assistant Examiner*—R. A. Rosenberger
*Attorney, Agent, or Firm*—Craig and Antonelli

[57] ABSTRACT

An alignment apparatus, in which a mask is overlaid on a wafer and a relative displacement between the wafer and a target pattern formed on the mask is detected to effect alignment thereof, comprises a slit frame adapted to reciprocate in a direction substantially parallel to the top surface of the mask and having a slit formed therein, an illumination optical system for illuminating the target pattern, an image formation optical system for forming the image of the target pattern onto the slit of the slit frame, a light sensing element mounted on the slit frame for detecting the target pattern image formed by the image formation optical system through the slit to convert the image into an electric signal, and a displacement detector for detecting the amount of movement of the reciprocation of the slit frame to convert the amount of movement into a position signal which the light sensing element scans, whereby the output signals from the displacement detector and the light sensing element are used to detect the relative position between the mask and the target pattern on the wafer and the mask is moved relative to the wafer such that the relative displacement amount becomes zero.

14 Claims, 19 Drawing Figures

ALIGNMENT APPARATUS

The present invention relates to an alignment apparatus for aligning two superimposed objects, and more particularly to an alignment apparatus for detecting the relative position between a mask and a wafer to align them when a pattern on the mask is to be exposed and printed onto a semiconductor device formed in the wafer.

A prior art alignment apparatus is disclosed in the specification of U.S. Patent application Ser. No. 126,597 now U.S. Pat. No. 3,683,195, corresponding to the Japanese Patent application No. 28857/72 which has been laid open under the Japanese Laying-Open No. 36765/72. The alignment apparatus of the above application comprises a photoelectric microscope which includes a drum having a group of slits in two rows extending in the widthwise direction thereof, each slit pair including a group of slits which incline at an angle of 45 degrees with respect to the direction of scan and transverse to each other, the slit pair being formed alternately in the direction of scan, a photo-electric conversion element to detect optical images transmitted through the slits in each row and to convert them into an image signal, the conversion element being stationarily positioned within the drum, and means for rotating the drum at a constant velocity such that the slits scan the optical images from the target patterns of the superimposed mask and the wafer at a constant velocity, whereby the amount of displacement between the target pattern on the mask and the target pattern on the wafer is detected by using an image signal derived from the photo-electric conversion element and the wafer is moved for alignment such that the amount of the displacement becomes zero. However, in the prior art alignment apparatus, since the slits formed in the drum also scan a light receiving surface of the photo-electric conversion element, the output level of the light sensing element fluctuates between the case where the slit scans the photo-electric conversion element while it is entirely within the light receiving area of the photo-electric conversion element and the case where the slit scans while it is completely out of the light receiving area. Furthermore, the light sensing element alternately receives optical images from both of the slits crossing at right angles to each other. Accordingly, in the prior art alignment apparatus, an effective processing area for the image signal derived from the light sensing element must be specified and the optical images from the slits must be discriminated as to which one of the slits they come from. Therefore, processing of the image signals from the light sensing element becomes complex and hence a probability of erroneous detection is high. Moreover, in the prior art alignment apparatus, since it is impossible to provide a photo-electric conversion element having a uniform sensitivity at the entire light receiving area of the photo-electric conversion element, the output level of the image signal from the light sensing element changes depending on the position of the slit as the slit scans across the light receiving surface of the light sensing element. This increases the noise level and lowers the S/N ratio. Furthermore, although it is assumed that the slits formed in the drum in the prior art alignment apparatus rotate at a constant speed to scan the target pattern, the slits, in actuality, do not rotate at the strictly constant speed. Since the above alignment apparatus converts the position of the target into the time in order to achieve the alignment, the variation in the rotation speed of the slits directly appears as a detection error. In addition, in the above alignment apparatus, since the drum having a number of slits formed therein is rotated by two drive wheels, the drum is of large size and hence from the operability point of view it is very difficult to exchange a new drum having slits adapted to the shape of the target pattern formed therein. Accordingly, there existed a disadvantage that it was difficult to exchange a drum having any desired target pattern.

It is a primary object of the present invention to provide an alignment apparatus wherein the light sensing element is mounted on a scanning member having a slit formed therein to simplify the processing of the image signal derived from the light sensing element for reducing the probability of erroneous detection and to increase the S/N ratio for enhancing the detection accuracy.

It is other object of the present invention to provide an alignment apparatus which can increase the alignment accuracy of a superimposed object without need for a constant scan speed of the slit.

It is a further object of the present invention to provide an alignment apparatus wherein the light sensing element does not erroneously operate even if noises are included in the detected image signal so that the amount of relative displacement between the target patterns of the two objects can be obtained at a high accuracy.

According to the present invention, an alignment apparatus for aligning target patterns formed on two objects superimposed on each other comprises an image formation optical system for forming an optical image derived from the target patterns, a slit member having its slits positioned on an image-forming plane on which the image is formed by the image formation optical system, the slit member being adapted to scan the image on the image-forming plane, a light sensing element mounted on the slit member for detecting the optical image transmitted through the slit of the slit member and converting the optical image into an image signal, and means for determining the amount of relative displacement between the two objects based on the image signal derived from the light sensing element, whereby the two objects are aligned with each other based on the displacement determined by the displacement determination means. According to a further aspect of the present invention, a displacement detector for detecting the amount of scan by the slit member is further provided so that the amount of relative displacement between the two objects is determined based on a scan displacement signal detected by the displacement detector and the image signal derived from the light sensing element. According to a further aspect of the present invention, the slit member is adapted to be linearly reciprocated in a horizontal direction for scan, and the slit pairs formed in the slit member each includes the image formation optical system which splits the optical image of the superimposed target patterns thereby forming the optical images of the respective axial directions, and then light sensing element pairs are mounted on the slit member for detecting the optical images in the respective axial directions formed by the image formation optical system, and a displacement detector for detecting the linearly reciprocating movement of the slit frame and means for determining the amount of relative displacement between two objects in response to the signals from the light sensing element and the displacement detector are included whereby the two objects are aligned with each other in response to the amount of the relative displacement determined by said displacement determination means.

The above and other objects, features and advantages of the present invention will become more apparent from the following description of the preferred embodiment of the invention when taken in conjunction with the accompanying drawings, in which.

Figure 1:
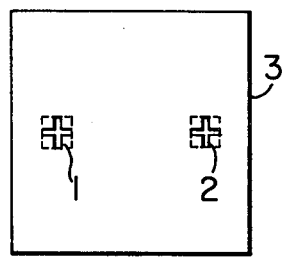
FIG. 1 shows a mask on which an alignment target pattern has been formed.
Figure 2:
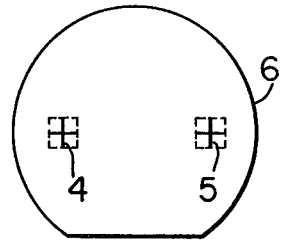
FIG. 2 shows a semiconductor wafer on which an alignment target pattern has been formed.

The present invention will now be explained with reference to the illustrated preferred embodiment thereof. FIG. 1 shows a mask 3 to be positioned and target patterns 1 and 2 formed at laterally symmetrical positions on the mask 3, each target pattern including four L-shaped dark line segments facing each other. FIG. 2 shows a semiconductor wafer 5 and target patterns 4 and 6 formed at laterally symmetrical positions on the semiconductor wafer 6 by an etching process, each target pattern including cross-shaped dark line segments. When the centers of the cross-shaped target patterns 4 and 5 on the wafer 6 are exactly positioned at the centers of the target patterns 1 and 2 of the mask 3, two points on the plane can be determined and the positional alignment between the semiconductor wafer 6 and the mask 3 is completed in all of the X-axis direction, Y-axis direction and the direction of rotation.

Figure 3:
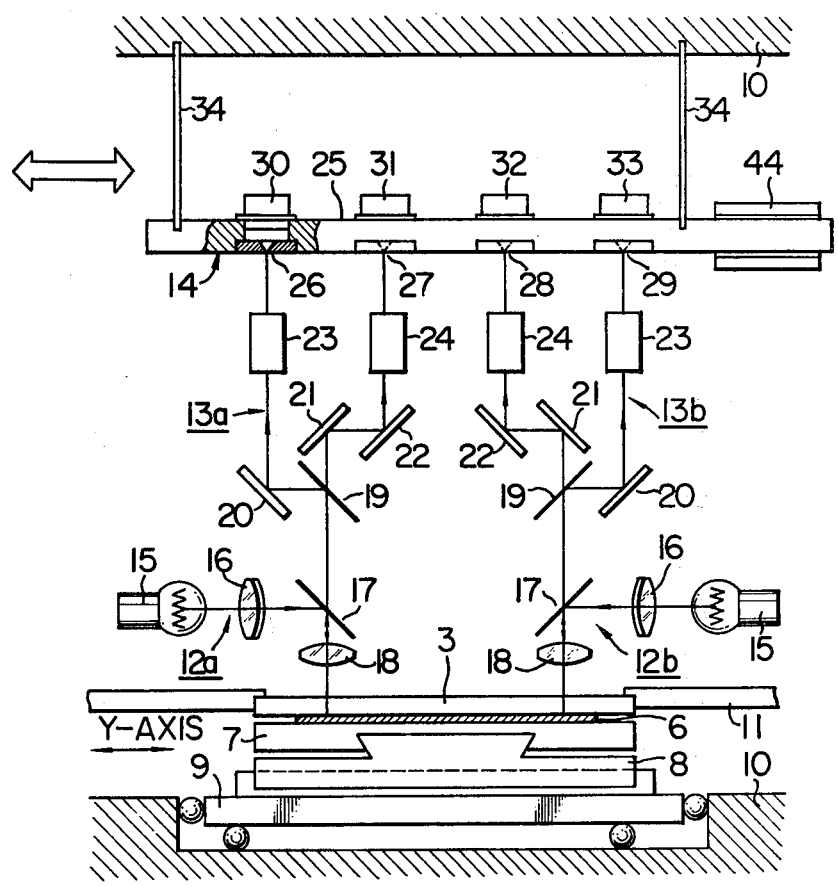
FIG. 3 is a schematic diagram illustrating one preferred embodiment of an alignment apparatus of the present invention.
Figure 4:
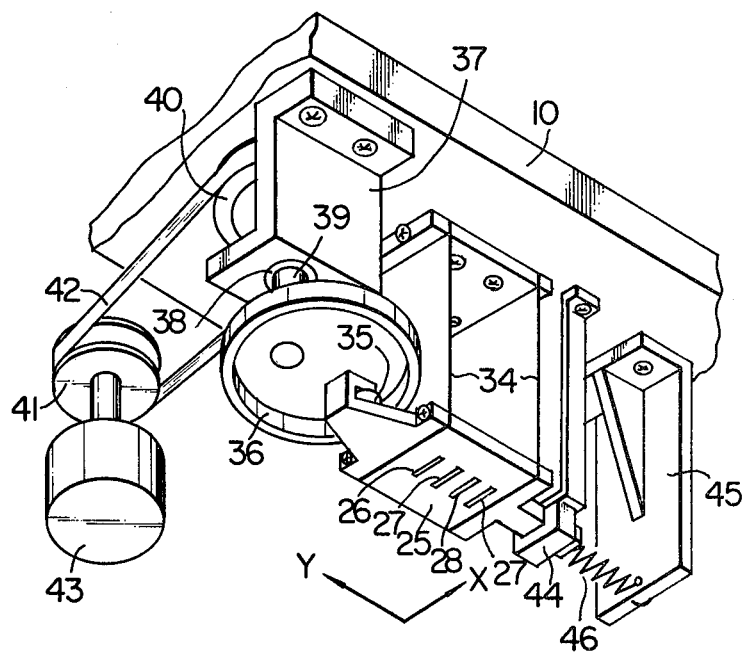
FIG. 4 is a perspective view, in an enlarged scale, of a slit frame shown in FIG. 3 and a mechanism for linearly reciprocating the slit frame.

A mask alignment apparatus for aligning the semiconductor wafer 6 relative to the mask 3 will now be particularly explained in conjunction with FIGS. 3 and 4. The semiconductor wafer 6 is mounted on an X-axis table 7 which can be moved in the X-axis direction by a driving force from drive means (not shown) such as a motor. The X-axis table 7, in turn, is mounted on a Y-axis table 8 which can be moved in the Y-axis direction transverse to the X-axis direction by a driving force from drive means (not shown) such as a motor, and the X-axis table 7 is slidable on the Y-axis table in the X-axis direction. The Y-axis table, in turn, is mounted on a turn table 9 which is rotatable in a plane parallel to the plane which includes the X-axis and the Y-axis with respect to a base 10 by a driving force from drive means (not shown) such as a motor, and the Y-axis table is slidable on the turn table 9 in the Y-axis direction. On the other hand, the mask 3 is fixed to a support 11 attached to the base 10 such that the mask 3 can be positioned to be superimposed on the semiconductor wafer 6. The mask 3 having a semiconductor integrated circuit pattern formed thereon for exposure and print is positioned to be superimposed on the semiconductor wafer 6 and a positional error between the target patterns 1 and 2 of the mask and the target patterns 4 and 5 on the semiconductor wafer 6 is detected by a photo-electric microscope which comprises two channels of illumination optical systems 12a and 12b and image formation optical systems 13a and 13b, each channel corresponding to the target pattern and the mask, and a scan device 14. The illumination optical systems 12a and 12b each comprises an illumination lamp 15, a condenser lens 16, a semi-transparent mirror 17 and an object lens 18. The image formation optical systems 13a and 13b each comprises an object lens 18, semi-transparent mirrors 17 and 19, reflecting mirrors 20, 21 and 22, an X-axis image rotator 23 and a Y-axis image rotator 24. The reflecting mirrors 21 and 22 are used to equalize the length of the light path so that the optical image passing through the semi-transparent mirror 19 is formed on the surface of the same level that the optical image reflected by the semi-transparent mirror 19 is formed on. The scan device 14 comprises: a slit frame 25 having X-axis detecting slits 26 and 29 and Y-axis detecting slits 27 and 28 arranged in the Y-axis direction as shown in FIG. 3; photo-electric conversion light sensing elements 30, 31, 32 and 33 fixed to the slit frame 25 in correspondence to the slits 26 to 29; parallel metallic leaf springs 34 for mounting the slit frame 25 to the base 10 such that the slit frame 25 can be displaced in the Y-axis direction; a cam 36 adapted to engage a cam follower 35 attached to one end of the slit frame 25 for imparting linear reciprocation movement to the slit frame 25; a shaft 39 for fixing the cam 36 and being rotatably supported by the base 10 and a bearing 38 mounted on a bracket 37 attached to the base 10; a motor 43 for linking a pulley 40 fixed to the shaft 39 to a pulley 41 fixed to an output shaft by a belt 42 for rotating the cam 36; a displacement detector 44 mounted at the other end of the slit frame 25 for detecting the amount of displacement of the slit frame 25; and a spring 46 suspended between the other end of the slit frame 25 and a bracket 45 attached to the base 10 for imparting an urging force to cause the cam follower 35 to engage in the cam surface of the cam 36.

In the illumination optical systems 12a and 12b, the illumination light radiated from the illumination lamp 15 is condensed by the condenser lens 16, reflected by the semi-transparent mirror 17, passes through the object lens 18 and illuminates the sample plane on which the target patterns 1 and 2 and the target patterns 4 and 5 are superimposed. For example, the optical image from the lefthand target patterns 1 and 4 passes through the object lens 18 and the semi-transparent mirror 17 and it is split into two parts by the semi-transparent mirror 19. The optical image reflected by the semi-transparent mirror 19 is deflected upwardly by the reflecting mirror 20 to enter the X-axis image rotator 23 where the optical image is rotated by a small correction angle in the plane perpendicular to the optical axis and formed onto the slit 26. On the other hand, the optical image passed through the semi-transparent mirror 19 is parallel-shifted by the reflection mirrors 21 and 22 to enter the Y-axis image rotator 24 where the optical image is rotated by 90 degrees in the opposite direction in a similar manner as the X-axis image rotator 23 and formed onto the slit 27. The direction of scan of the slits 26 and 27 is in the Y-axis direction, and the target patterns 4 and 5 and the target patterns 1 and 2 are constructed by bi-axial line segments, respectively, the output images from the X-axis image rotator 23 and the Y-axis image rotator 24 are rotated by 90 degrees with respect to the optical images entering thereinto, respectively. The reason for splitting the optical path by the semi-transparent mirror 19 is to detect the position errors of the superimposed target patterns in X-axis and Y-axis directions which are transverse to each other. Since the Y-axis image rotator 24 rotates the optical image by 90 degrees, the X-axis image rotator 23 need not be provided. The purpose of the provision of the X-axis image rotator 23 is to rotate the optical image by a small correction angle in order to exactly align the direction of scan of the slit 26 to the direction of movement of the X-axis table 7. For the righthand target patterns 2 and 5, a similar optical system symmetrically arranged is used to form the optical images onto the X-axis detecting slit 29 and the Y-axis detecting slit 28 formed in the same slit frame 14 which is scanned. The slit frame 25 including the slits 26 to 29 having the optical images formed thereon is scanned by deforming the parallel leaf springs 34 in the thicknesswise direction by linear reciprocation movement of the cam follower 35 which is engaged with the cam surface 36 of the cam 36 by urging force of the spring 46, which cam 36 is rotated by the rotation of the motor 43. The light sensing elements 30 to 33 mounted on the slit frame 25 behind the slits 26 to 29 receive the optical images scanned through the slits 26 to 29 to produce image signals. The displacement detector 44 comprising a linear displacement detector using a displacement detection grid detects the amount of displacement of the slit frame 25. The magnification of an image formed by the object lens 18 is about 10 times and the slit frame 14 is driven to reciprocate over the area of about 10 mm within which the images of the target patterns on the mask 3 and the wafer 6 will be formed, so that the slits 26 to 29 will scan over the area of 10 mm, thereby to detect the images of the target patterns. The size of the target patterns is about 0.5 mm by 0.5 mm within which any pattern except the target is not formed. The slits are arranged to scan all over the area within which the optical images of the target patterns will possibly locate, thereby detecting the target patterns.

Figure 5:
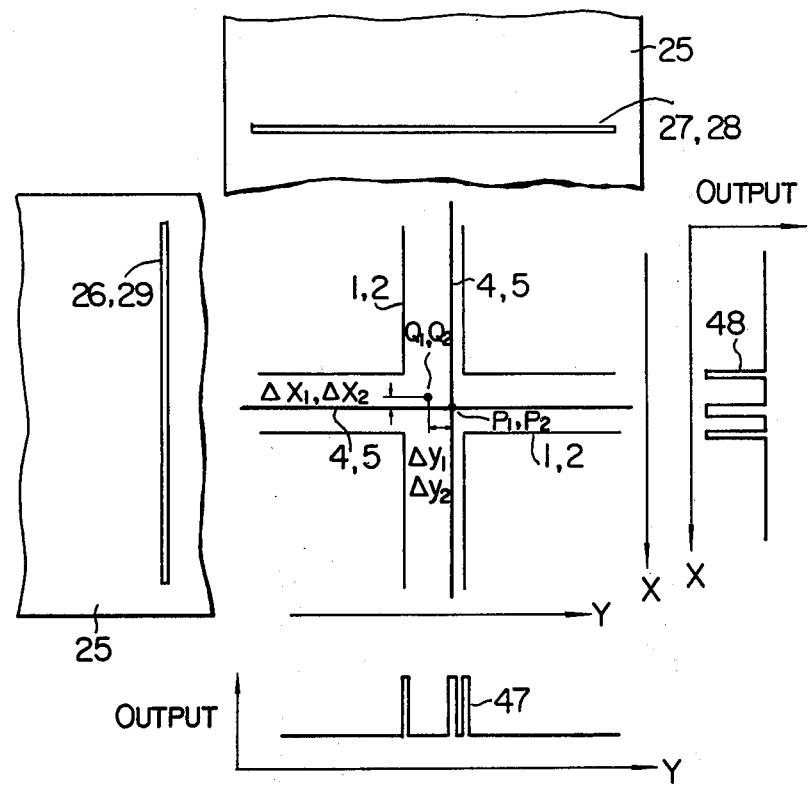
FIG. 5 illustrates X-axis and Y-axis scanning slits, relative positional relationship between superimposed target patterns and an image signal derived from a light sensing element when the slits are driven to scan.

The detection of the position error between the mask 3 and the semiconductor wafer 6 will now be explained. FIG. 5 shows the X-axis scanning slits 26 and 29, the Y-axis scanning slits 27 and 28, positional relation between the target patterns 4 and 5 of the wafer 6 and the target patterns 1 and 2 of the mask 3, a square-wave signal 47 derived by binary-coding of the image signal detected by the light sensing elements 30 and 33 when the slits 26 and 29 are scanned in the Y-axis direction, and a square-wave signal 48 derived by binary-coding of the image signal detected by the light sensing elements 31 and 32 when the slits 27 and 28 are driven to scan in the Y-axis direction. While the slits actually scan by making reciprocating movement in only the Y-axis direction as stated above, the slits 27 and 28 scan the sample plane in the X-axis direction because the image rotator is included. A processing circuit for the image signal detected by the light sensing elements 30 to 33 is first explained with reference to FIG. 6. The output image signal from the light sensing elements 30 to 33 mounted on the surface of the slit frame 25 opposite from the light-receiving surface thereof in correspondence with the slits 26 to 29 respectively are fed to an amplifier 49, thence to a differentiating circuit 50, a binary-coding circuit 51 with a hysteresis comparison function, and finally to an arithmetical circuit 52 for calculating the amount of displacement between the target patterns.

Figure 6:
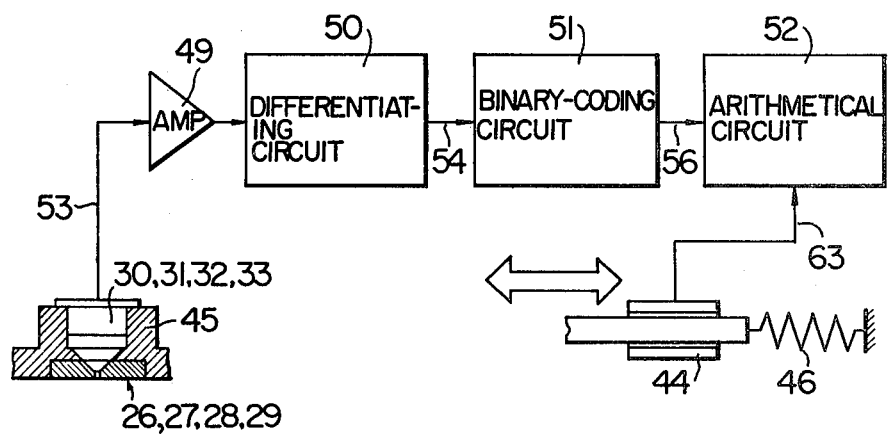
FIG. 6 is a schematic diagram of a processing circuit for processing signals delivered from the light sensing element and the displacement detector.
Figure 8:
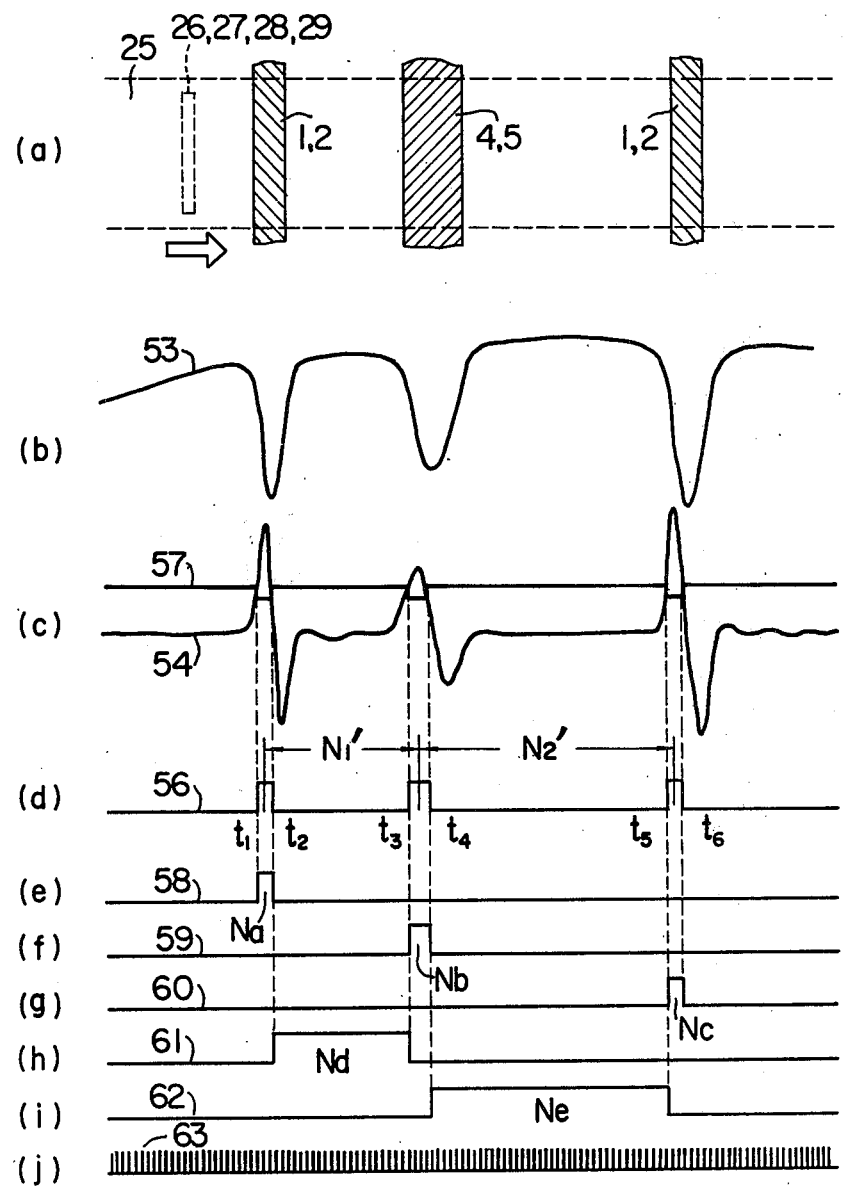
FIG. 8(a) illustrates the scan of the target patterns by the slits and FIGS. 8(b)-(j) show waveforms of the signals processed by the circuit of FIG. 6.

The processing of the image signal derived from the light sensing elements 30 to 33 will now be explained in conjunction with FIG. 8 while referencing the processing circuit of FIG. 6. As shown in FIG. 8(a), the optical images of the alignment target patterns 1 and 2 and the target patterns 4 and 5 are superimposed to each other and formed on the slit frame 25. As the slits 26 to 29 are driven to scan in the direction of an arrow, an image signal 53 having a waveform shown in FIG. 8(b) is detected by the light sensing elements 30 to 33. The image signal 53 is fed to the amplifier circuit 49 where it is amplified and then fed to a differentiating circuit 50 where it is converted into a differentiated signal 54 having a waveform shown in FIG. 8(c). The differentiating circuit comprises a high-pass filter so that a low frequency component of the image signal is blocked thereby to eliminate the waving of the image signal. The binary-coding circuit 51 includes an operational amplifier 55, the differentiated signal 54 being coupled to a minus ($-$) input terminal thereof through the resistor $R_1$ while a sum of a hysteresis signal fed back from an output terminal through a resistor $R_3$ and a reference threshold voltage signal $V_a$ derived from a center terminal of a potentiometer $R_5$ connected between $-V_{BB}$ and $+V_{CC}$, through a resistor $R_4$ is coupled to a plus ($+$) input terminal, and a binary-coded signal 56 is produced at the output terminal through a resistor $R_2$. When the differentiated signal 54 is compared in the comparison circuit having the hysteresis characteristic, it is equivalently compared with the signal 57 shown in FIG. 8(c), resulting in the binary-coded signal 56 shown in FIG. 8(d). For the purpose of explanation, the rising and falling timings of the binary-coded signal 56 shown in FIG. 8(d) are designated as $t_1$, $t_2$, $t_3$, $t_4$, $t_5$ and $t_6$. The arithmetical circuit 52 has five gates a, b, c, d and e which operate in synchronism with the timing of the binary-coded signal 56 to form gate signals 58, 59, 60 and 61 shown in FIGS. 8(e) to (i). Namely, the gate a is opened during a period of $t_1$ to $t_2$, the gate b is opened during a period of $t_3$ to $t_4$, the gate c is opened during a period of $t_5$ to $t_6$, the gate d is opened during a period of $t_2$ to $t_3$, and the gate e opened during a period of $t_4$ to $t_5$. On the other hand, during the scanning period of the slits 26 to 29, the displacement detector 44 produces one pulse for each unit length movement resulting in pulse signal 63 having a waveform shown in FIG. 8(j). The pulse signal 63 is fed to the arithmetical circuit 52 and thence to the gates a, b, c, d and e so that the pulses during the opening of the gates are counted by a counter. Assuming that the counts are Na, Nb, Nc, Nd and Ne, respectively, the amount of displacement between the targets, that is, the pulse counts $N_1'$ and $N_2'$ between the targets are given by the relation of formulas (1).

$$\left. \begin{array}{l} N_1' = \dfrac{Na + Nb}{2} + Nd \\[6pt] N_2' = \dfrac{Nb + Nc}{2} + Ne \end{array} \right\} \quad (1)$$

Figure 7:
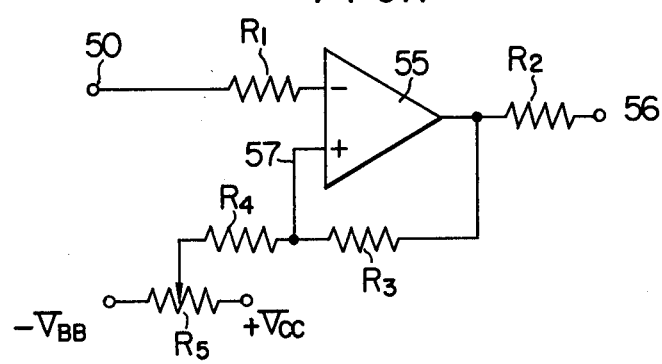
FIG. 7 is a circuit diagram illustrating a preferred embodiment of a binary-coding circuit shown in FIG. 6.
Figure 9:
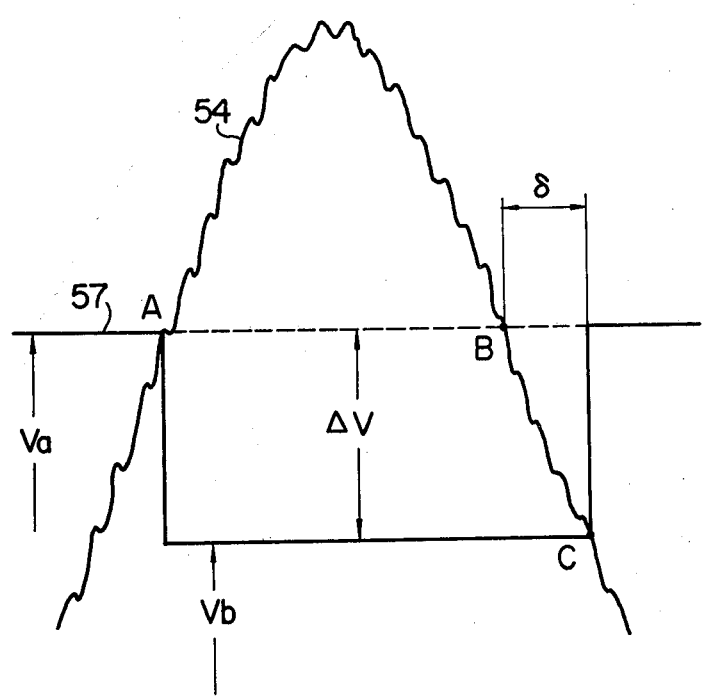
FIG. 9 illustrates the binary representation of a differentiated signal by the binary-coding circuit of FIG. 7.

The resulting counts, however, include errors due to a difference in phase leading between the target patterns 1, 2 and the target patterns 4, 5 because the differentiated signal 54 is used. The differentiating circuit, in general, tends to emphasize the noise in the input signal. In actual, the enlarged differentiated signal shows the superposition of high frequency noise as shown in FIG. 9. Therefore, when it is compared with a fixed level signal for binary-coding the same, correct binary representation cannot be attained because of the influence of the noise. This drawback can be eliminated by the comparing circuit having the hysteresis shown in FIG. 7. Namely, as shown in FIG. 9, for the rise of the differentiated signal 54, the reference voltage level is set at $V_a$ and the comparison timing is set at point A. Thereafter, the reference voltage is lowered by $\Delta V$ to $V_b$. Accordingly, for the fall of the differentiated signal 54, the comparison timing is at the point C. By selecting the magnitude of $\Delta V$ to be larger than the noise level, effective binary representation can be achieved. In order to measure the displacement between the targets, however, the comparison timing for the fall of the differentiated signal 54 should be at the point B. Therefore, there exists an error S between the timings at the point B and the point C, resulting in a measurement error for the displacement between the targets. In FIG. 6, the phase leading error due to the inclusion of the differentiating circuit 50 and the measurement error due to the inclusion of the hysteresis comparison circuit can be eliminated by averaging the results of the reciprocating scan by the slit frame 25. Thus, by calculating the average of the counts $N_1'$ and $N_2'$ for the output pulses of the displacement detector between the targets during the forward scanning period and the counts $N_1''$ and $N_2''$ during the backward scanning period by the following formulas (2), the true displacements $N_1$ and $N_2$ can be determined.

$$N_1 = \frac{N_1' + N_1''}{2} \\ N_2 = \frac{N_2' + N_2''}{2} \quad \quad (2)$$

According, a Y-axis error $\Delta y_1$ between the center $R_1$ of the target pattern 1 of the mask 3 detected by the Y-axis scan of the slit 26 having the light sensing element 26 mounted behind thereof as shown in FIG. 5 and the center of the target pattern 4 of the wafer 6 can be determined from the $N_1$ and $N_2$ of the formulas (2) in accordance with the following formula.

$$\Delta y_1 = k(N_2 - N_1) \quad (3)$$

where k is a length converted factor per pulse detected by the displacement detector 44. In a similar manner, an X-axis error $\Delta x_1$ can be determined for the lefthand target. For the righthand target pattern, the X-axis error $\Delta x_2$ and the Y-axis error $\Delta y_2$ can be also determined.

Figure 10:
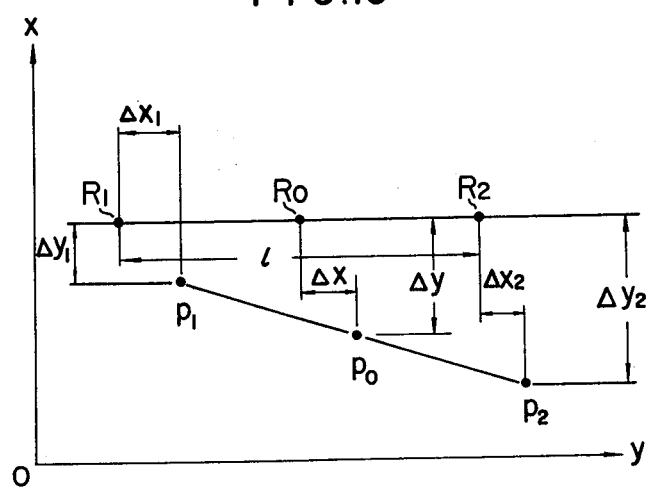
FIG. 10 shows an error between the target pattern on the mask and the target pattern on the wafer.

The respective spacings between the targets on the mask and between those on the wafer do not always concide, so that when the lefthand targets are exactly positioned, the righthand targets may not be exactly positioned. Therefore, the error between the spacing between the target patterns 4 and 5 of the wafer 6 and the spacing between the target patterns 1 and 2 of the mask 3 is equally divided on either side so that the position error between the wafer 6 and the target patterns 4 and 5 is minimized over the entire surface of the wafer 6. This will be explained with reference to FIG. 10. $R_1$, $R_2$ and $R_0$ designate the centers of the lefthand target 1, the righthand target 2 of the mask 3 and the center between the lefthand and righthand targets 1 and 2, respectively, and $P_1$, $P_2$ and $P_0$ designate the centers of the lefthand target 4, the righthand target 5 of the wafer 6 and the center between the lefthand and righthand targets 4 and 5, respectively. In putting the X-axis and Y-axis errors (position errors) between the wafer and the mask with respect to the lefthand target to $\Delta x_1$ and $\Delta y_1$, and with respect to the righthand target to $\Delta x_2$ and $\Delta y_2$, respectively, then the X-axis and Y-axis errors (position errors) $\Delta x$ and $\Delta y$ between the centers $R_0$ and $P_0$ between the mask 3 and the wafer 6 are determined by the following equation.

$$\Delta x = \frac{\Delta x_1 + \Delta x_2}{2} \\ \Delta y = \frac{\Delta y_1 + \Delta y_2}{2} \quad \quad (4)$$

An error of inclination $\Delta \theta$ between the mask 3 and the wafer 6 can be determined from the following relation with a sufficiently high approximation.

$$\Delta \theta \approx \frac{\Delta y_2 - \Delta y}{l} \text{ (radian)} \quad (5)$$

where l is the separation between the targets.

According, by manually or automatically moving the X-axis table 7, the Y-axis table 8 and the turn table 9 shown in FIG. 3 by the error amounts $\Delta x$, $\Delta y$ and $\Delta \theta$ determined above, the mask 3 and the semiconductor wafer 6 are aligned with each other. After the tables have been moved for alignment, the position error between the mask 3 and the wafer 6 is again detected by the scan of the slit to determine whether the error is within an allowable range. If the error is not within the allowable range, the corrective operation is repeated until the error comes into the allowable range.

As described hereinabove, according to the present invention, the processing of the image signal derived from the light sensing element can be simplified and the probability of erroneous detection can be lowered, and the S/N ratio of the image signal derived from the light sensing element can be increased. Furthermore, according to the present invention, since the scanning speed can be arbitrarily set, a speed control circuit is not required, so that the scan apparatus can be simplified. Moreover, since the scan is made in reciprocating manner, the detection results can be readily averaged to increase the detection accuracy.

What is claimed is:
1. An alignment apparatus comprising:
  first means for positioning in superimposed relationship a mask and a wafer each having an alignment target pattern formed thereon;
  an image formation optical system for forming an optical image derived from the target patterns superimposed by said first means;
  a scanning means having a light sensing element mounted on a slit member having a slit formed therein, said slit member linearly reciprocating to cause both said slit and said light sensing element to scan, said slit being formed to pass the optical image formed by said image formation optical system through a small width area thereof, said light sensing element converting the optical image received through said slit into an image signal, and said scanning means including a displacement detector for detecting the amount of scan of said slit member;

second means for determining the amount of relative displacement between said mask and said wafer in response to the imge signal detected by the light sensing element of said scanning means and the scan displacement signal detected by said displacement detector; and third means for relatively moving said mask and wafer for alignment in response to the amount of relative displacement determined by said second means.

2. An alignment apparatus according to claim 1, wherein said scanning means linearly reciprocates said slit member by supporting said slit member on a base with parallel-positioned metallic leaf springs and a cam mechanism to impart a lateral force to said member.

3. An alignment apparatus comprising:

first means for positioning in superimposed relationship a mask and a wafer each having an alignment target pattern formed thereon;

an image formation optical system for forming an optical image derived from the target patterns superimposed by said first means;

scanning means having a light sensing element mounted on a slit member having a slit formed therein, said slit member linearly reciprocating to cause both said slit and said light sensing element to scan, said slit being formed to pass the optical image formed by said image formation optical system through a small width area thereof, said light sensing element converting the optical image received through said slit into an image signal, said scanning means being adapted to cause said slit member to scan, said scanning means including a displacement detector for detecting the amount of scan of said slit member;

second means for calculating the average of the amount of relative displacement between said mask and said wafer obtained during a forward scan and the amount of relative displacement between said mask and said wafer obtained during a backward scan, in response to the image signal detected by the light sensing element of said scanning means and the scan displacement signal detected by said displacement detector;

and third means for relatively moving the mask and the wafer for alignment in response to the amount of the relative displacement determined by said second means, wherein said second means includes a differentiating circuit for differentiating the image signal detected by said light sensing element and binary-coding circuit for binary-coding the differentiated signal by a threshold level having a hysteresis comparison function, and said second means determines the amount of relative displacement between said mask and said wafer in response to the binary-coded signal derived from said binary-coding circuit.

4. An alignment apparatus according to claim 3, wherein said scanning means reciprocates said slit member at least over an area of no more than two times the size of the optical image of the alignment target pattern formed by said image formation optical system.

5. An alignment apparatus according to claim 3, wherein said scanning means linearly reciprocates said slit member by supporting said member on a base with parallel-positioned metallic leaf springs and a cam mechanism to impart a lateral force to said member.

6. An alignment apparatus according to claim 3, wherein the target pattern formed on said mask is constituted by at least two line segments inclined raltive to each other at a given angle, and the target pattern formed on said wafer is constituted by a group of parallel line segment pairs inclined relative to each other at an angle substantially equal to said given angle and arranged to be substantially in parallel to said line segments of the mask target pattern.

7. An alignment apparatus according to claim 6, wherein said mask and wafer each includes at least two target patterns disposed at symmetrical positions.

8. An alignment apparatus according to claim 6, wherein said image formation optical system includes means for splitting the optical image from the superimposed target patterns into optical patterns for each of the line segments and forms said optical patterns at different positions, and said scanning means includes at least a pair of slits oriented in the direction of the optical image of said line segments and arranged at different positions on said slit member, and light sensing elements each corresponding to a respective one of said slits.

9. An alignment apparatus according to claim 8, wherein said image formation optical system includes an image rotator for rotating the optical image of at least one of the line segments by a predetermined angle about an optical axis.

10. An alignment apparatus according to claim 3, wherein said scanning means linearly reciprocates said slit member thereby to cause said slit and said light sensing element to scan, wherein the target pattern formed on said mask is constituted by at least two line segments inclined relative to each other at a given angle, and the target pattern formed on said mask is constituted by a group of parallel line segment pairs inclined relative to each other at an angle substantially equal to said given angle and arranged to be substantially in parallel to said line segments of the mask object target pattern.

11. An alignment apparatus comprising:

first means for positioning in superimposed relationship a mask and a wafer each having an alignment target pattern formed thereon;

an image formation optical system for forming an optical image derived from the target patterns superimposed by said first means;

scanning means having a light sensing element mounted on a slit member having a slit formed therein, said slit being formed to pass the optical image formed by said image formation optical system through a small width area thereof, said light sensing element converting the optical image received through said slit into an image signal, said scanning means being adapted to cause said member to scan, said scanning means further including a displacement detector for detecting the amount of the scan of said member;

second means for determining the amount of the relative displacement between said mask and said wafer in response to the image signal detected by the light sensing element of said scanning means and the scan displacement signal detected by said displacement detector; and third means for relatively moving the mask and the wafer for alignment in response to the amount of the relative displacement determined by said second means; and wherein said scanning means linearly receiprocates said member to cause said slit and said light sensing element to scan, said second means includes a differentiating circuit for differentiating the image signal detected by said light sensing element and a binary-coding circuit for binary-coding the differentiated signal by a threshold level having a hysteresis comparison function, and said second means determines the amount of relative displacement between said mask and said wafer in response to the binary-coded signal derived from said binary-coding circuit and the scan displacement amount signal derived from said displacement detector.

12. An alignment apparatus according to claim 11, wherein said displacement detector is a linear displacement detector including a displacement detection grid for producing a pulse output for each unit amount of displacement thereof.

13. An alignment apparatus comprising:
(a) first means for relatively positioning in superimposed relationship a mask having first alignment target patterns disposed at least in symmetrical positions thereon and a wafer having second alignment target patterns disposed opposite to said first alignment target patterns;
(b) an image formation optical system for forming at least four optical images and for splitting each of said optical images derived from each of said target patterns superimposed by said first means into at least two different component images;
(c) scanning means including: a slit member having at least four slots with at least four light sensing elements mounted each at one of said four slits, said slits each being formed to pass each of said at least four optical images formed by said image formation optical system through a small-width area thereof, said light sensing elements each converting into an electrical signal said at least four optical images passing through said slits, means for linearly reciprocating in a predetermined direction said slit member so that said light sensing elements may scan in linearly reciprocating movement; and a displacement detector for detecting the amount of scan of said slit member with high accuracy;
(d) second means for determining the amount of relative displacement of x-axis components and y-axis components of said target patterns obtained during a forward scan in relationship between an image signal represented by time intervals and obtained from each of said light sensing elements and a detected signal representative of an amount of displacement with respect to a period of time and obtained from said displacement detector during the forward scan of said slit member, and also determining the amount of relative displacement of x-axis components and y-axis components of said target patterns obtained during a backward scan in relationship between said image signal obtained from each of said light sensing elements and said detected signal obtained from said displacement detector during the backward scan of said slit member, and then determining a mean value of displacement $\Delta x = \Delta x_1 + \Delta x_2/2$, $\Delta y = \Delta y_1 + \Delta y_2/2$, $\Delta \theta \div \Delta y_2 - \Delta y_1/l$, in each of x-axis, y-axis and rotational directions $\theta$ of said mask and wafer by averaging the amount of both relative displacements obtained during the forward and backward scans, where l is a distance between target patterns;
(e) third means for relatively moving the mask and the wafer for alignment so that the amount of displacement obtained from said second means in each of x-axis, y-axis and rotational directions $\theta$ between the mask and the wafer is eliminated, wherein said second means comprises a differentiating circuit for differentiating the image signal detected by said light sensing elements and a binary-coding circuit for binary-coding the differentiated signal by a threshold level having a hysteresis comparison function, to thereby determine the amount of every relative displacement of target patterns in relationship between time intervals of binary-coded signals obtained from said binary-coding circuit and the amount of displacement of scan with respect to a period of time obtained from said displacement detector.

14. An alignment apparatus claimed in claim 13, wherein said linearly reciprocating scanning means of the scanning means is supported to a base by metallic leaf springs disposed in parallel to said slit member to thereby scan the slit member in linearly reciprocating movement by engaging a cam follower disposed at one end of said slit member with a cam which is driven in rotation.

* * * * *